United States Patent
Jung

(10) Patent No.: US 11,457,164 B2
(45) Date of Patent: Sep. 27, 2022

(54) IMAGE SENSING DEVICE

(71) Applicant: SAMSUNG ELECTRONICS CO., LTD., Suwon-si (KR)

(72) Inventor: Hyun Yong Jung, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 214 days.

(21) Appl. No.: 16/735,182

(22) Filed: Jan. 6, 2020

(65) Prior Publication Data

US 2020/0388645 A1 Dec. 10, 2020

(30) Foreign Application Priority Data

Jun. 4, 2019 (KR) .................. 10-2019-0065676

(51) Int. Cl.
- *H04N 5/374* (2011.01)
- *H01L 27/146* (2006.01)
- *H04N 5/335* (2011.01)
- *H04N 5/357* (2011.01)
- *H04N 5/378* (2011.01)
- *H04N 5/217* (2011.01)
- *H04N 5/361* (2011.01)
- *H04N 5/369* (2011.01)

(52) U.S. Cl.
CPC ..... *H04N 5/3741* (2013.01); *H01L 27/14603* (2013.01); *H01L 27/14612* (2013.01); *H01L 27/14643* (2013.01); *H04N 5/335* (2013.01)

(58) Field of Classification Search
CPC .... H04N 5/3741; H04N 5/335; H04N 5/3575; H04N 5/378; H04N 5/2176; H04N 5/361; H04N 5/369; H04N 5/374; H04N 5/3745; H04N 5/37452; H01L 27/14603; H01L 27/14612; H01L 27/14643; H01L 27/14609
USPC ................................. 348/281, 294, 302, 308
See application file for complete search history.

(56) References Cited

U.S. PATENT DOCUMENTS

| 7,071,505 B2 | 7/2006 | Rhodes | |
| 2009/0033759 A1* | 2/2009 | Wakabayashi | H04N 5/335 348/222.1 |
| 2009/0244348 A1* | 10/2009 | Moholt | H01L 27/14609 348/308 |

(Continued)

FOREIGN PATENT DOCUMENTS

| JP | 3664035 B2 | 6/2005 |
| JP | 2013-187728 A | 9/2013 |

(Continued)

*Primary Examiner* — Albert H Cutler
(74) *Attorney, Agent, or Firm* — Sughrue Mion, PLLC

(57) ABSTRACT

Provided is an image sensing device including a photoelectric element configured to receive a reset signal at a first end and connected to a sensing node at a second end, a reset transistor configured to reset a floating diffusion at a first voltage, a capacitor disposed between the floating diffusion and the sensing node, a driving transistor configured to generate a pixel signal from a charge generated by the photoelectric element based on a second voltage, and a selection transistor configured to provide the pixel signal to an external device, wherein while the selection transistor is turned on, the reset transistor is turned off at a first time point, and the sensing node is reset by the reset signal at a second time point that is later than the first time point.

19 Claims, 20 Drawing Sheets

(56) References Cited

U.S. PATENT DOCUMENTS

| | | | | |
|---|---|---|---|---|
| 2013/0015326 A1* | 1/2013 | Tamura | ............ | H01L 27/14612 |
| | | | | 250/208.1 |
| 2013/0200479 A1* | 8/2013 | Sakano | ................ | H04N 5/3591 |
| | | | | 257/435 |
| 2013/0222584 A1* | 8/2013 | Aoki | ........................ | H04N 7/18 |
| | | | | 348/143 |
| 2019/0288023 A1* | 9/2019 | Raynor | .................. | H04N 5/363 |
| 2021/0385403 A1* | 12/2021 | Eki | ................... | H01L 27/14634 |

FOREIGN PATENT DOCUMENTS

| | | | |
|---|---|---|---|
| JP | 2014-197862 | A | 10/2014 |
| JP | 2016-208351 | A | 12/2016 |
| JP | 6126275 | B2 | 5/2017 |
| JP | 6441971 | B2 | 12/2018 |
| KR | 10-1448151 | B1 | 10/2014 |

\* cited by examiner

IMAGE SENSING DEVICE

CROSS REFERENCE TO THE RELATED APPLICATION

This application claims priority to Korean Patent Application No. 10-2019-0065676 filed on Jun. 4, 2019 in the Korean Intellectual Property Office, the disclosure of which is incorporated herein by reference in its entirety.

BACKGROUND

Field

Example embodiment of the present disclosure relate to an image sensing device.

2. Description of the Related Art

An image sensing device is one of semiconductor elements that may convert optical information into an electrical signal. An image sensing device may include a charge coupled device (CCD) image sensing device and a complementary metal-oxide semiconductor (CMOS) image sensing device.

The CMOS image sensor (CIS) may include a plurality of pixels arranged two-dimensionally. Each of the pixels may include, for example, a photodiode (PD). The photodiode may serve to convert light to be incident into an electrical signal.

Recently, with development of computer and communications industries, demands for image sensors with improved performance have increased in various fields, such as digital cameras, video cameras, smartphones, game consoles, security cameras, medical micro cameras, and robots. Further, as semiconductor devices are being highly integrated, image sensors are also more highly integrated.

SUMMARY

Example embodiments provide an image sensing device having improved sensing image quality, by improving dark level characteristic and performing reliable correlated double sampling (CDS).

According to an aspect of an example embodiment, there is provided an image sensing device including a photoelectric element configured to receive a reset signal at a first end and connected to a sensing node at a second end, a reset transistor configured to reset a floating diffusion at a first voltage, a capacitor disposed between the floating diffusion and the sensing node, a driving transistor configured to generate a pixel signal from a charge generated by the photoelectric element based on a second voltage, and a selection transistor configured to provide the pixel signal to an external device, wherein while the selection transistor is turned on, the reset transistor is turned off at a first time point, and the sensing node is reset by the reset signal at a second time point that is later than the first time point.

According to another aspect of an example embodiment, there is provided an image sensing device including a pixel array including at least one pixel, and a timing generator configured to provide a first reset signal, a second reset signal, and a selection signal to the pixel array, wherein each of the at least one pixel includes a photoelectric element configured to reset a storage node connected to a first end based on the first reset signal received at a second end, a reset transistor gated to the second reset signal and configured to reset a floating diffusion, a capacitor disposed between the storage node and the floating diffusion, a driving transistor configured to generate a pixel signal based on a charge generated by the photoelectric element, and a selection transistor which is gated to a selection signal and configured to output the pixel signal to an external device, and the timing generator configured to first disable the second reset signal while enabling the selection signal, and then enable the first reset signal.

According to yet another aspect of an example embodiment, there is provided an image sensing device including a first circuit configured to generate a first pixel signal based on a charge generated by a first photoelectric element using three transistors and configured to output the first pixel signal to a first comparator, a second circuit configured to generate a second pixel signal based on a charge generated by a second photoelectric element using four transistors and configured to output the second pixel signal to a second comparator, and a ramp signal generator configured to provide a first ramp signal to the first comparator and configured to provide a second ramp signal to the second comparator, wherein the ramp signal generator is configured to provide the first comparator with a first ramp signal to which a first pulse of a first magnitude and a second pulse of a second magnitude that is greater than the first magnitude are sequentially applied, and configured to provide the second comparator with a second ramp signal to which a third pulse of a third magnitude and a fourth pulse of a fourth magnitude that is greater than the third magnitude are sequentially applied, during a sensing period of the first pixel signal and the second pixel signal.

BRIEF DESCRIPTION OF THE DRAWINGS

The above and other aspects and features will become more apparent by describing in detail example embodiments thereof with reference to the attached drawings, in which.

DETAILED DESCRIPTION OF THE EMBODIMENTS

Figure 1:
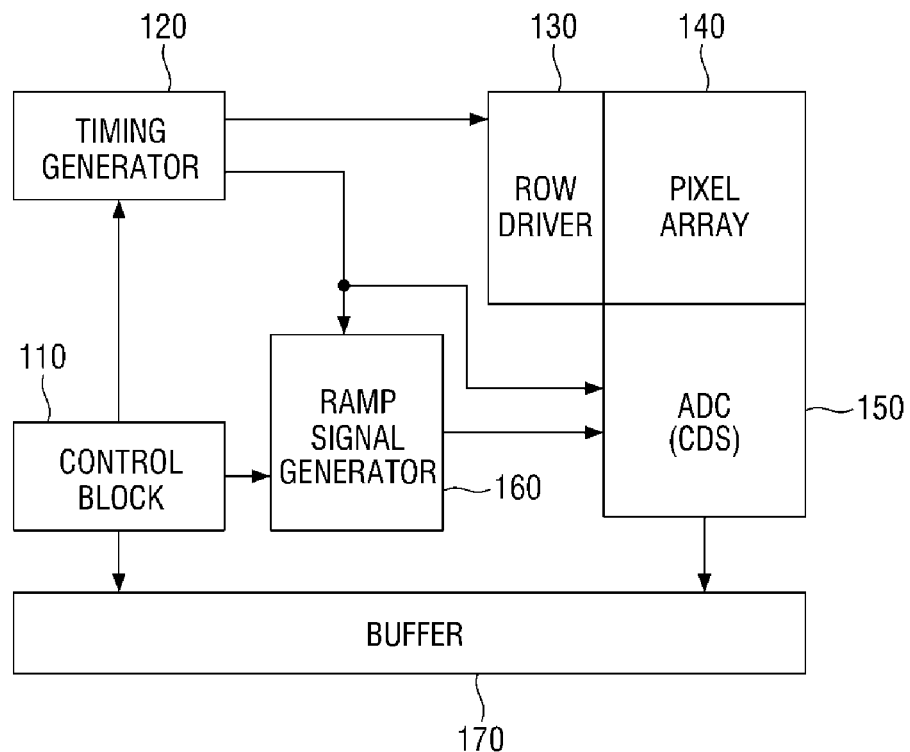
FIG. 1 is a block diagram of an image sensing device according to example embodiments.

FIG. 1 is a block diagram of an image sensing device according to example embodiments.

Referring to FIG. 1, an image sensing device 100 may include a control register block 110, a timing generator 120, a row driver 130, a pixel array 140, an analog-digital converter 150, a ramp signal generator 160, and a buffer 170.

The control register block 110 may generally control the operation of the image sensing device 100. In particular, the control register block 110 may directly transmit an operation signal to the timing generator 120, the ramp signal generator 160, and the buffer 170.

The timing generator 120 may generate a signal to be used as a reference for the operation timing of various constituent elements of the image sensing device 100. An operation timing reference signal generated by the timing generator 120 may be transferred to the row driver 130, the analog-digital converter 150, the ramp signal generator 160, and the like.

The ramp signal generator 160 may generate and transmit a ramp signal used in the analog-digital converter 150. For example, the analog-digital converter 150 may include a correlated double sampler (CDS), a comparator, and the like. The ramp signal generator 160 may generate and transmit a ramp signal used for the correlated double sampler (CDS), the comparator, and the like.

The buffer 170 may include, for example, a latch unit. The buffer 170 may temporarily store an image signal to be provided to the outside, and may transmit the image data to an external memory or an external device.

The pixel array 140 may sense an external image. The pixel array 140 may include a plurality of pixels or unit pixels. The row driver 130 may selectively activate a row of the pixel array 140.

The analog-digital converter 150 may sample the pixel signal provided from the pixel array 140, compare the pixel signal with the ramp signal, and then convert the analog image data into digital image data based on the result of comparison.

Although the drawings show that the analog-digital converter 150 includes the correlated double sampler (CDS), embodiments are not limited thereto. According to an example embodiment, the correlated double sampler (CDS), the comparator, and the like may be implemented as logic circuits separated from the analog-digital converter 150.

Figure 2:
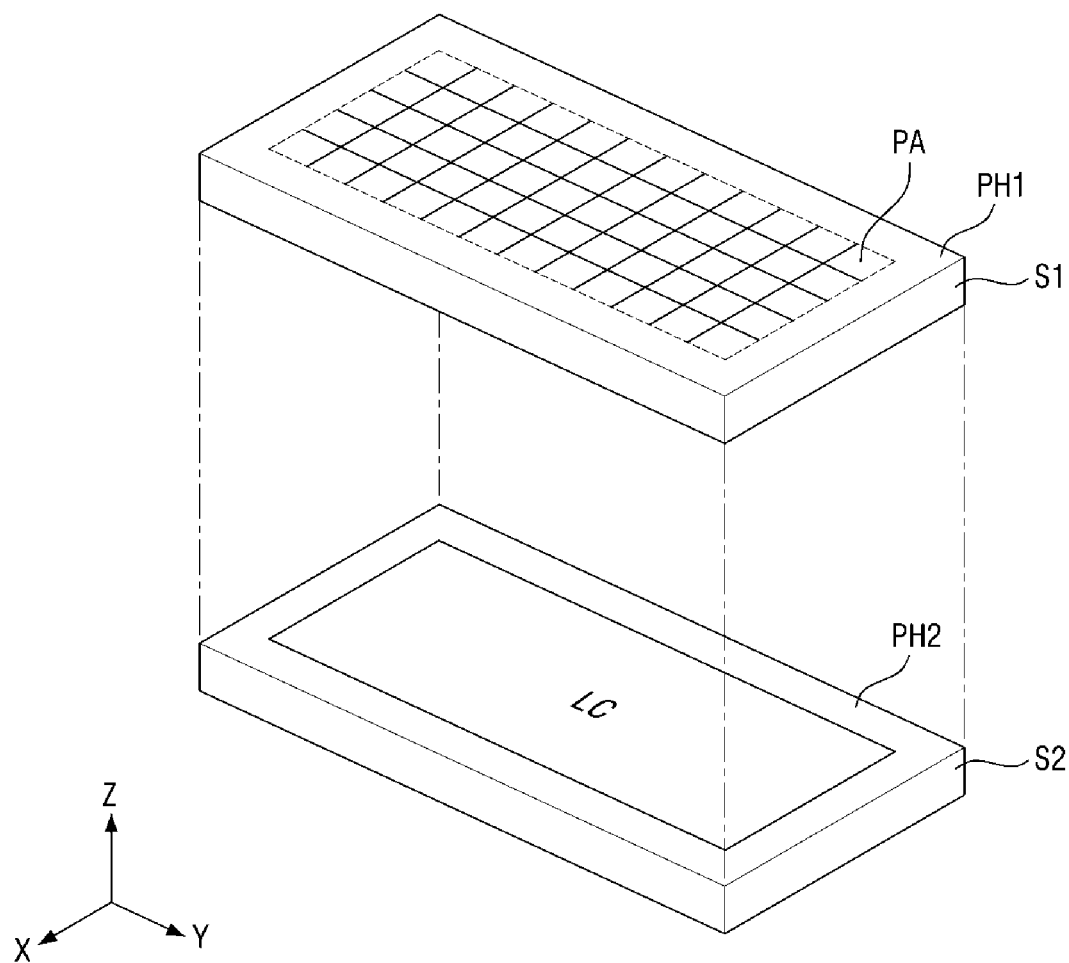
FIG. 2 is a diagram illustrating a conceptual layout of the image sensing device according to example embodiments.

FIG. 2 is a diagram illustrating a conceptual layout of the image sensing device according to example embodiments.

Referring to FIG. 2, the image sensing device 100 may include a first region S1 and a second region S2 stacked in a first z-axis direction (e.g., a vertical direction). The first and second regions S1 and S2 may extend in a second x-axis direction and a third y-axis direction as illustrated, and blocks illustrated in FIG. 1 may be disposed in the first and second regions S1 and S2.

According to an example embodiment, a third region in which a memory is disposed may be disposed below the second region S2. The memory disposed in the third region may receive the image data transmitted from the first and second regions S1 and S2, store or process the image data, and re-transmit the image data to the first and second regions S1 and S2. The memory may include memory elements such as a dynamic random access memory (DRAM) element, a static random access memory (SRAM) element, a spin transfer torque magnetic random access memory (STT-MRAM) element, and a flash memory element. For example, when the memory includes a DRAM element, the memory may receive transmission of the image data at a relatively high speed and process the image data.

The first region S1 includes a pixel array region PA and a first peripheral region PH1, and the second region S2 may include a logic circuit region LC and a second peripheral region PH2. The first and second regions S1 and S2 may be sequentially stacked in the first z-axis direction.

In the first region S1, the pixel array region PA may be a region in which the pixel array 140 (FIG. 1) is disposed. The pixel array region PA may include a plurality of unit pixels PX (FIG. 4) arranged in a matrix form. Each pixel PX may include photodiodes and transistors. More specific explanation thereof will be described later.

The first peripheral region PH1 may include a plurality of pads and may be disposed around the pixel array region PA. The plurality of pads may transmit and receive electrical signals to and from an external device or the like.

In the second region S2, the logic circuit region LC may include electronic elements including a plurality of transistors. The electronic elements included in the logic circuit region LC may be electrically connected to the pixel array region PA to provide a constant signal to each unit pixel PX of the pixel array region PA or control the output signal.

For example, the control register block 110, the timing generator 120, the row driver 130, the analog-digital converter 150, the ramp signal generator 150, the buffer 170, and the like described with reference to FIG. 1 may be disposed in the logic circuit region LC. In the logic circuit region LC, for example, elements other than the pixel array 140 in FIG. 1 may be disposed.

The second peripheral region PH2 in the second region S2 may be disposed in a region corresponding to the first peripheral region PH1 of the first region S1. However, embodiments are not limited thereto.

Figure 3:
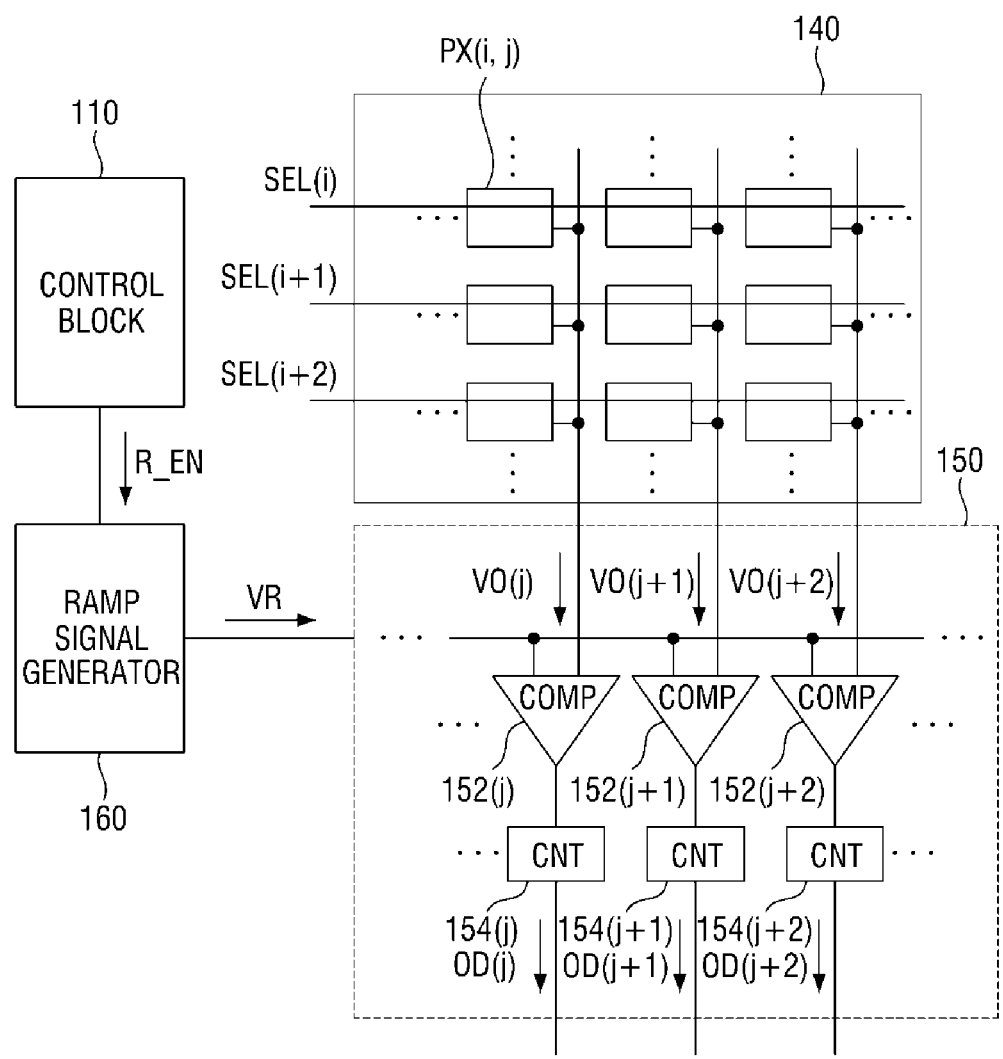
FIG. 3 is a block diagram relating to a pixel array and an analog-digital converter of FIG. 1.

FIG. 3 is a block diagram relating to the pixel array 140 and the analog-digital converter 150 as illustrated in FIG. 1.

Referring to FIG. 3, the pixel array 140 may include a plurality of pixels PX (i, j). The plurality of pixels PX (i, j) may be arranged in a plurality of rows i and a plurality of columns j. A row line may be disposed for each of the plurality of rows i, and a column line may be disposed for each of the plurality of columns j. Each pixel PX (i, j) may be selected by selection signals SEL(i), SEL(i+1), and SEL(i+2) to output pixel signals VO(j), VO(j+1) and VO(j+2).

The analog-digital converter 150 may include a plurality of comparators 152(j), 152(j+1) and 152(j+2) and a plurality of counters 154(j), 154(j+1) and 154(j+2) respectively connected to a plurality of columns j of the pixel array 140. The analog-digital converter 150 may perform correlated double sampling and analog-digital conversion operations, for example, through the plurality of comparators 152(j), 152(j+1) and 152(j+2) and the plurality of counters 154(j), 154(j+1) and 154(j+2).

The ramp signal generator 160 may generate a ramp signal VR. The ramp signal VR is a signal for converting the pixel signals VO(j), VO(j+1) and VO(j+2), which are analog signals, into digital signals OD(j), OD(j+1) and OD(j+2), and may have, for example, a triangular wave shape.

The ramp signal generator 160 may generate a ramp signal VR in response to a ramp enable signal R_EN generated by the control register block 110. According to example embodiments, the ramp signal generator 160 may control the ramp signal VR by causing a pulse according to a voltage drop to be generated in the ramp signal VR during a section in which the ramp enable signal R_EN is enabled. However, embodiments are not limited thereto.

The ramp signal VR generated by the ramp signal generator 160 may be provided to the respective comparators 152(j), 152(j+1) and 152(j+2). Each of the comparators 152(j), 152(j+1) and 152(j+2) may correspond to the column line j of one pixel PX(i, j) on a one-to-one basis.

The comparators 152(j), 152(j+1) and 152(j+2) may compare the ramp signal VR with the pixel signals VO(j), VO(j+1) and VO(j+2). Specifically, the comparators 152(j), 152(j+1) and 152(j+2) may compare the ramp signal VR with the reset voltages of the pixel signals VO(j), VO(j+1) and VO(j+2), and may compare the ramp signal VR with the signal voltages of the pixel signals VO(j), VO(j+1) and VO(j+2). A specific description thereof will be described later.

According to example embodiments, the comparators 152(j), 152(j+1) and 152(j+2) compare the ramp signal VR with the pixel signals VO(j), VO(j+1) and VO(j+2), and may output a comparison signal corresponding to the result thereof. The comparison signals may indicate which one of the ramp signal VR and the pixel signals VO(j), VO(j+1) and VO(j+2) is larger, as binary signals. For example, when the ramp signal VR is larger than the pixel signals VO(j), VO(j+1) and VO(j+2), "1" may be output, and when the pixel signals VO(j), VO(j+1) and VO(j+2) are larger than the ramp signal VR, "0" may be output. Alternatively, it is also possible to configure to output the comparison signals in reverse.

Each of counters 154(j), 154(j+1) and 154(j+2) may correspond to the comparators 152(j), 152(j+1) and 152(j+2) on a one-to-one basis. That is, one comparison signal may be counted by one of the counters 154(j), 154(j+1) and 154(j+2). However, embodiments are not limited thereto.

The counters 154(j), 154(j+1) and 154(j+2) may count, for example, how long the comparison signals output by the comparators 152(j), 152(j+1) and 152(j+2) maintain the same value, based on the time point at which the lamp enable signal R_EN is enabled or based on the time point at which another counter signal is enabled. Further, digital signals OD(j), OD(j+1) and OD(j+2) of pixel signals VO(j), VO(j+1) and VO(j+2) that are analog signals may be output based on the counting result thereof.

Figure 4:
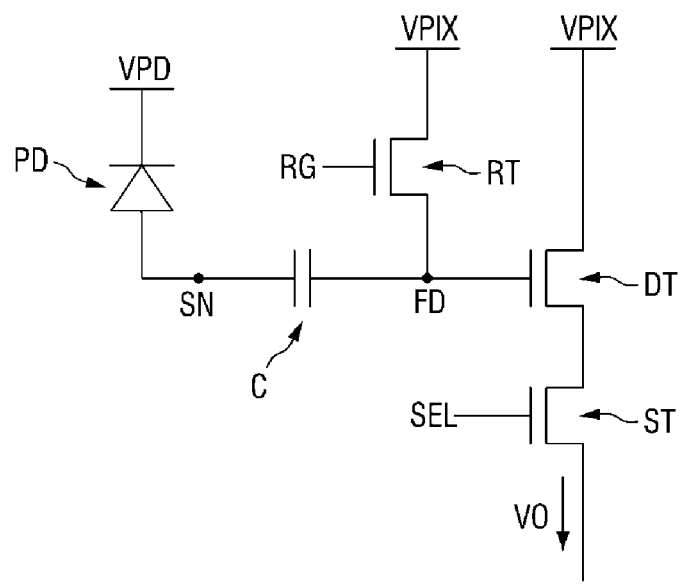
FIG. 4 is a unit pixel circuit diagram included in the pixel array of FIG. 3.

FIG. 4 is a unit pixel circuit diagram included in the pixel array 140 of FIG. 3.

Referring to FIG. 4, the pixel PX may include a photoelectric element PD, a reset transistor RT, a driving transistor DT, a selection transistor ST, and a capacitor C.

The circuit illustrated in FIG. 4 may be a three transistor (3T) pixel circuit in which the photoelectric element PD disposed in the unit pixel PX outputs the charge generated by sensing the external image as the pixel signal VO, using three transistors.

A gate terminal of the driving transistor DT is connected to a floating diffusion FD, and the charge generated by the photoelectric element PD may be transferred to the floating diffusion FD through a storage node SN. The driving transistor DT may be operated as a source follower buffer amplifier by the charge transferred to the floating diffusion FD. That is, the driving transistor DT amplifies the charge generated by the photoelectric element PD using a pixel voltage VPIX and transferred to the floating diffusion FD and may transfer the charge to the selection transistor ST.

The selection transistor ST may be turned on by a selection signal SEL provided by the row driver 130 (FIG. 1), and may perform switching and addressing operations. When the selection signal SEL is applied from the row driver, the pixel signal VO may be output to a column line connected to the selection transistor ST. The pixel signal VO may be detected by the analog-digital converter 150 (FIG. 1).

The reset transistor RT may be turned on by a reset signal RG which is input by the row driver 130 (FIG. 1). When the reset transistor RT is turned on by the reset signal RG, the floating diffusion FD may be reset to the pixel voltage VPIX.

According to the example embodiment, the reset transistor RT and the driving transistor DT are illustrated as being each provided with the pixel voltage VPIX, but embodiments are not limited thereto. The voltage provided to the reset transistor RT and the driving transistor DT may be modified to a form different from that illustrated in FIG. 4. For example, in example embodiments, a read voltage may be provided to the reset transistor RT, and a power supply voltage may be applied to the driving transistor DT.

The photoelectric element PD may generate a charge by sensing an external image or light. In example embodiments, the photoelectric element PD may include an organic photo diode.

When the photoelectric element PD is an organic photo diode, the photoelectric element PD may include first electrode and a second electrode disposed in parallel to each other, and an organic light conversion layer may be provided between the first and second electrodes, and the organic light conversion layer may generate a charge by receiving light of a predetermined wavelength band.

A storage reset signal VPD may be provided to a cathode of the photoelectric element PD, and an anode of the photoelectric element PD may be connected to the storage node SN. As will be described in more detail later, the storage reset signal VPD is a variable signal in which an enable section and a disable section are repeated. When the storage reset signal VPD is enabled, the storage node SN may be reset. That is, the storage reset signal VPD may reset the storage node SN by moving the charge of the storage node SN according to the signal level.

The photoelectric element PD may be, for example, a photodiode, a phototransistor, a photogate, a pinned photodiode or a combination thereof, but embodiments are not limited thereto.

The capacitor C may be disposed between the storage node SN and the floating diffusion FD. Based on the capacitor C, the storage node SN and the floating diffusion FD may not be reset at the same time, and the dark level characteristics of the image sensing device may be improved. A specific description thereof will be described later.

In example embodiments, the capacitor C may include, for example, a capacitor used in a DRAM cell. Hereinafter, a more specific description will be given with reference to FIG. 5.

Figure 5:
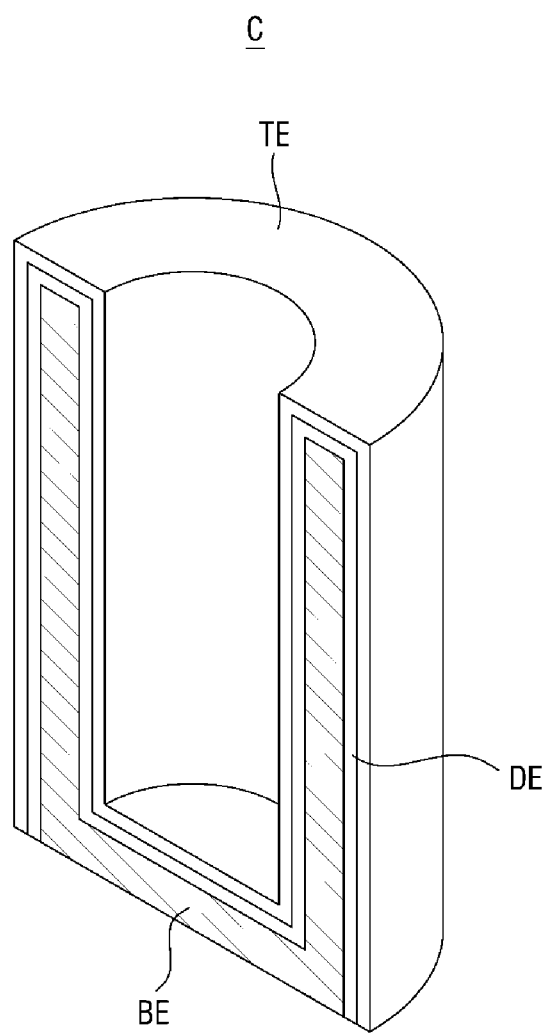
FIG. 5 is a diagram illustrating a capacitor of FIG. 4.

FIG. 5 is a diagram illustrating the capacitor of FIG. 4.

Referring to FIG. 5, the capacitor C may include a top electrode TE, a bottom electrode BE, and a dielectric film DE.

In example embodiments, in order to maximize the storage capacity of the capacitor C, the top electrode TE and the bottom electrode BE may be formed in a cylinder shape, and a dielectric film DE may be disposed between them.

For example, as illustrated in FIG. 5, the top electrode TE and the bottom electrode BE of the capacitor C may be formed in a hollow circular cylinder shape, and face each other with a dielectric film DE interposed between them. The dielectric film DE may be formed in a conformal form along the surface of the bottom electrode BE.

The dielectric film DE may include, for example, oxide-nitride, oxide-nitride-oxide, metal oxide, and the like. In example embodiments, the dielectric film DE may include a hafnium oxide film (e.g., HfO2), but embodiments are not limited thereto.

The top electrode TE and the bottom electrode BE may include, for example, polysilicon, metal, metal nitride, and the like. In example embodiments, the top electrode TE may include a titanium nitride film (e.g., TiN), but embodiments are not limited thereto as well.

In example embodiments, the capacitor C may be disposed in the pixel array region PA of FIG. 2. That is, the capacitor C may be disposed on the same layer as the photoelectric element PD. However, embodiments are not limited thereto, and the position at which the capacitor C is disposed may be changed.

Hereinafter, the operation of the unit pixel PX circuit will be described with reference to FIGS. 6 to 10.

Figure 6:
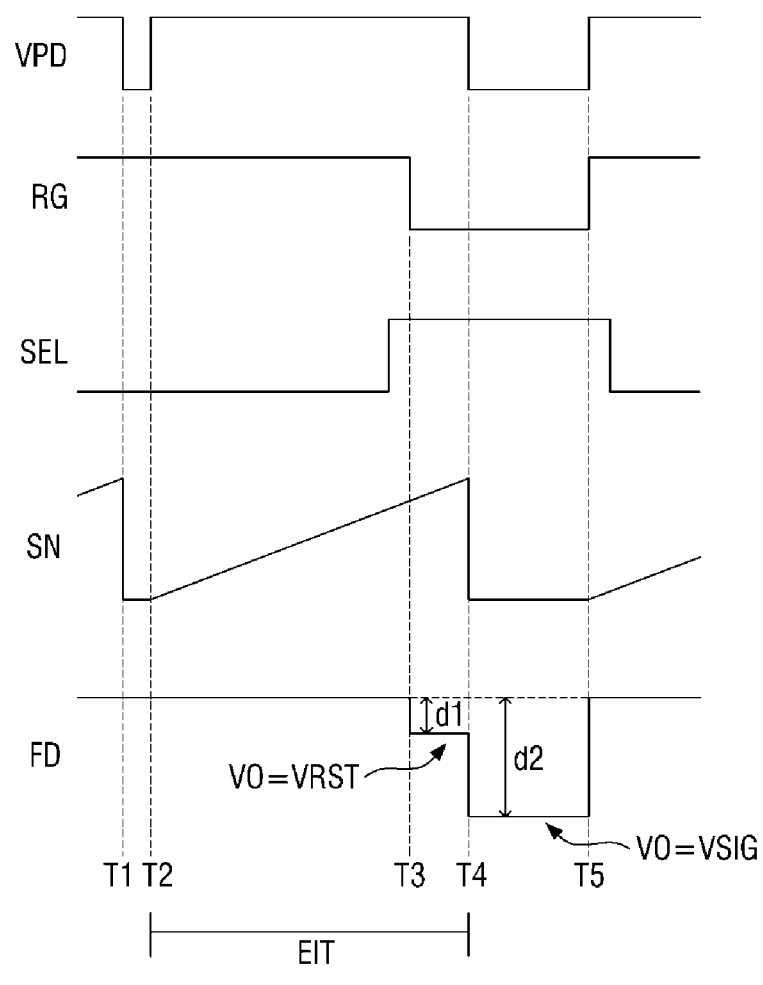
FIG. 6 is a timing chart illustrating an operation of a circuit of FIG. 4.

FIG. 6 is a timing chart illustrating the operation of the circuit of FIG. 4. FIGS. 7 to 10 are diagrams illustrating the operation of the circuit of FIG. 4.

FIG. 6 is a diagram illustrating a waveform of a signal applied to a unit pixel during one sensing period and a change in charge level of each node. The storage reset signal VPD, the reset signal RG, the selection signal SEL and the like illustrated in FIG. 6 may be provided from, for example, a timing generator 120 (FIG. 1) that is controlled by the control register block 110 (FIG. 1). However, embodiments are not limited thereto.

Figure 7:
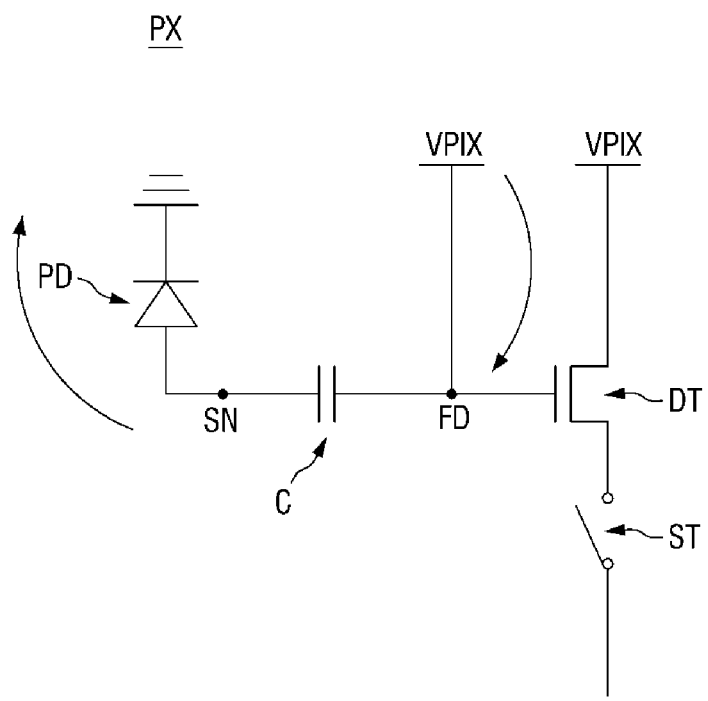
FIGS. 7 to 10 are diagrams illustrating the operation of the circuit of FIG. 4.

First, referring to FIGS. 6 and 7, at a first time point T1, the storage reset signal VPD transits from a logical high level (H level) to a logical low level (L level). That is, the storage reset signal VPD may be enabled. Therefore, the charge of the storage node SN may be released and, the storage node SN may be reset.

On the other hand, the reset signal RG may maintain the H level as it is. That is, the reset signal RG may maintain the enable state. As the reset signal RG maintains the H level, the reset transistor RT (FIG. 5) maintains a turn-on state, and thus, the pixel voltage VPIX may be provided to the floating diffusion FD. Therefore, the floating diffusion FD maintains a state that is reset to the pixel voltage VPIX.

The selection signal SEL may maintain the L level. That is, the selection signal SEL may maintain a disabled state. Therefore, the selection transistor ST (FIG. 5) maintains a turn-off state. As a result, the pixel signal is not output to the outside VO (FIG. 5).

Figure 8:
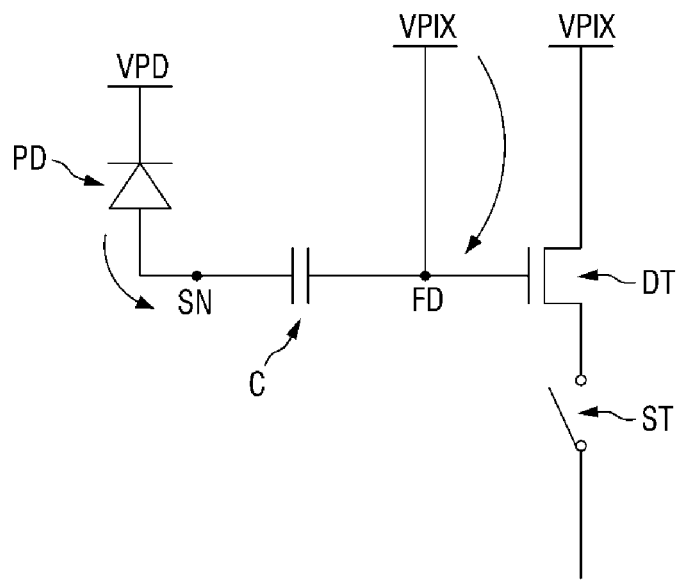

Next, referring to FIGS. 6 and 8, at a second time point T2, the storage reset signal VPD transits from the L level to the H level. That is, the storage reset signal VPD is disabled. Therefore, the charge generated from the photoelectric element PD is accumulated in the storage node SN.

On the other hand, although the pixel voltage VPIX is provided to the floating diffusion FD, since the floating diffusion FD and the storage node SN are separated by the capacitor C, the charge generated from the photoelectric element PD is accumulated in the storage node SN.

Figure 9:
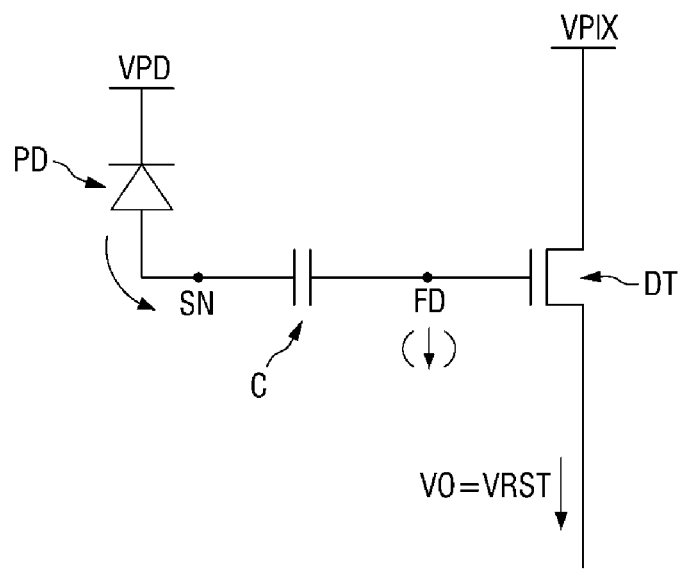

Next, referring to FIGS. 6 and 9, at a third time point T3, in a state in which the storage reset signal VPD maintains the H level, the reset signal RG transits from the H level to the L level. That is, in a state in which the storage reset signal VPD is disabled, the reset signal RG is disabled.

As the reset signal RG is disabled, the reset transistor RT (FIG. 5) is turned off, and the floating diffusion FD floats. However, the charge level of the floating diffusion FD decreases by a first level d1 due to element characteristics.

On the other hand, in advance to the third time point T3, the selection signal SEL may have already changed from the L level to the H level. That is, the selection signal SEL is already in the enabled state at the third time point T3. As a result, the driving transistor DT outputs the charge level of the floating diffusion FD as the pixel signal VO to the outside, using the pixel voltage VPIX. At this time, since the charge level of the floating diffusion FD is a level that decreases by the first level d1 from the pixel voltage VPIX, the pixel signal VO that is output from the pixel PX may be the reset voltage VRST decreased by the first level d1 from the reference voltage.

Figure 10:
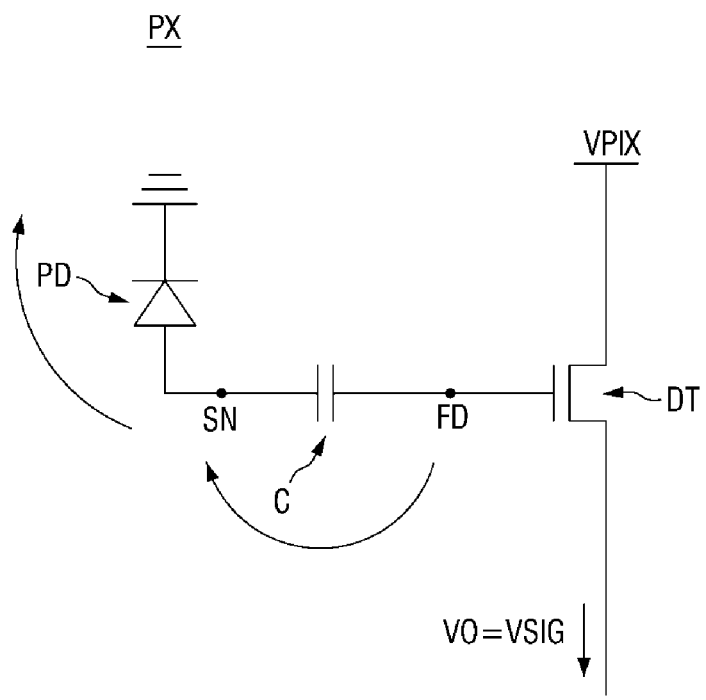

Next, referring to FIGS. 6 and 10, at a fourth time point T4, the storage reset signal VPD transits to the L level. That is, the storage reset signal VPD is enabled.

As the storage reset signal VPD is enabled, the storage node SN is reset, and the charge level of the floating diffusion FD decreases by the charge accumulated in the storage node SN by the capacitor C. That is, the charge level of the floating diffusion FD decreases by the second level d2 due to the influence of the storage node SN.

On the other hand, since the selection signal SEL remains enabled at the fourth time point T4, the driving transistor DT outputs the charge level of the floating diffusion FD as the pixel signal VO to the outside, using the pixel voltage VPIX. At this time, since the charge level of the floating diffusion FD is a level that decreases by the second level d2 from the pixel voltage VPIX, the pixel signal VO that is output from the pixel PX may be a signal voltage VSIG decreased by the second level d2 from the reference voltage.

Thereafter, at a fifth time point T5, the storage reset signal VPD transits to the H level, and the reset signal RG transits to the H level. That is, the storage reset signal VPD is disabled and the reset signal RG is enabled.

Thereafter, by repeating the operations described above, the unit pixel PX may generate and output a pixel signal VO from the charge generated by the photoelectric element PD.

Referring to FIG. 6, since the charge generated by the photoelectric element PD is accumulated in the storage node SN from the second time point T2 at which the storage node SN is first reset to the fourth time point T4 at which the storage node SN is reset again, an effective accumulation time EIT may be formed from the second time point T2 to the fourth time point T4. Further, since the reset voltage VRST and the signal voltage VSIG are output to the outside in the form of the pixel signal VO while the selection transistor ST (FIG. 5) is turned on, a section in which the selection signal SEL maintains the H level may be one sensing period 1H.

Hereinafter, the operation of the analog-digital converter in which the pixel signal VO output from the pixel PX is converted into a digital signal will be described with reference to FIG. 11.

Figure 11:
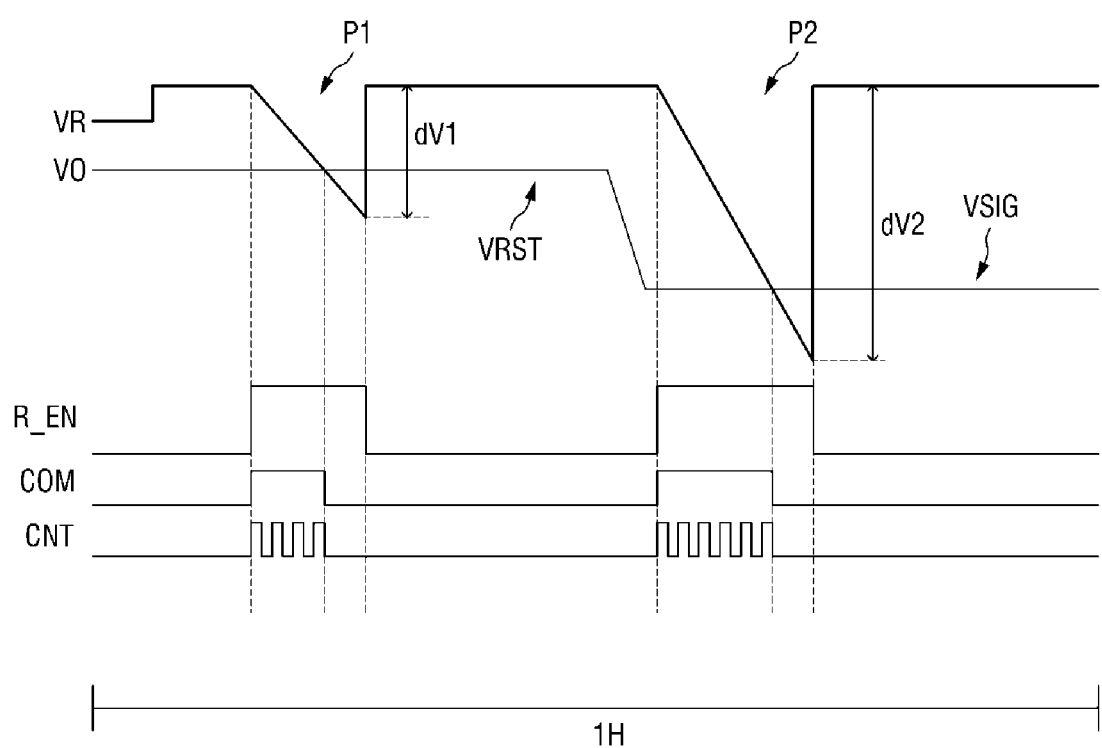
FIG. 11 is a timing chart illustrating the operation of the analog-digital converter of FIG. 3.

FIG. 11 is a timing chart illustrating the operation of the analog-digital converter of FIG. 3. The operation of the analog-digital converter described below is merely an example, and a detailed configuration thereof may be modified.

Referring to FIGS. 3 and 11, the ramp signal generator 160 may provide the comparator 152(j) with a ramp signal VR to which a first pulse P1 having a magnitude decreased by the first level dV1 from the reference voltage and a second pulse P2 having a magnitude decreased by the second level dV2 from the reference voltage are sequentially applied during one sensing period 1H.

Specifically, the ramp signal generator 160 sequentially generates the first pulse P1 having the first magnitude, and the second pulse P2 having the second magnitude greater than the first magnitude as the ramp signal VR in response to the ramp enable signal R_EN during the one sensing period 1H, and may provide the ramp signal VR to the comparator 152j.

The comparator 152j compares the ramp signal VR with the pixel signal VO from a specific time point, for example, a time point at which the comparator 152j is enabled, and may output the comparison result as the comparison signal COM to the counter 154j.

The counter 154j may count the comparison signal COM to convert the pixel signal VO into a digital signal.

That is, the image sensing device 100 (FIG.) according to the example embodiment has a 3T structure in which the unit pixel PX generates the pixel signal VO using three transistors, and compares the pixel signal VO generated in the 3T structure with the ramp signal VR to which the first pulse P1 having the first magnitude and the second pulse P2 having the second magnitude greater than the first magnitude are sequentially applied to output digital image data.

FIGS. 12 to 15 are diagrams illustrating the effects of the image sensing device according to a related art.

Figure 12:
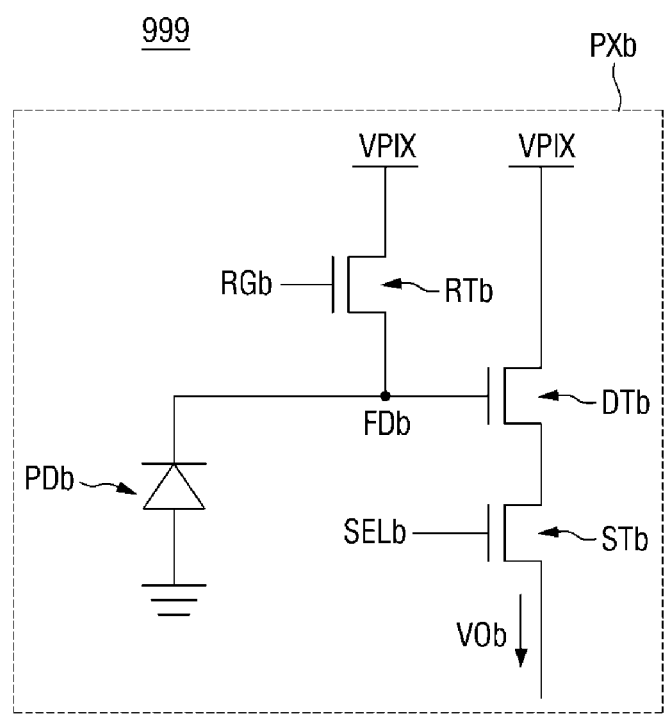
FIGS. 12 to 15 are diagrams illustrating the effects of the image sensing device according to related art.

FIG. 12 is a circuit diagram of a unit pixel PXb of an image sensing device 999 that is different from the example embodiment described above with reference to FIG. 5.

Referring to FIG. 12, the pixel PXb may include a photoelectric element PDb, a reset transistor RTb, a driving transistor DTb, and a selection transistor STb. The illustrated circuit may be a 3T pixel circuit in which a photoelectric element PDb disposed in the unit pixel PXb accumulates the charge generated by sensing an external image in the floating diffusion FDb, and outputs the accumulated charge as the pixel signal VOb using three transistors.

Figure 13:
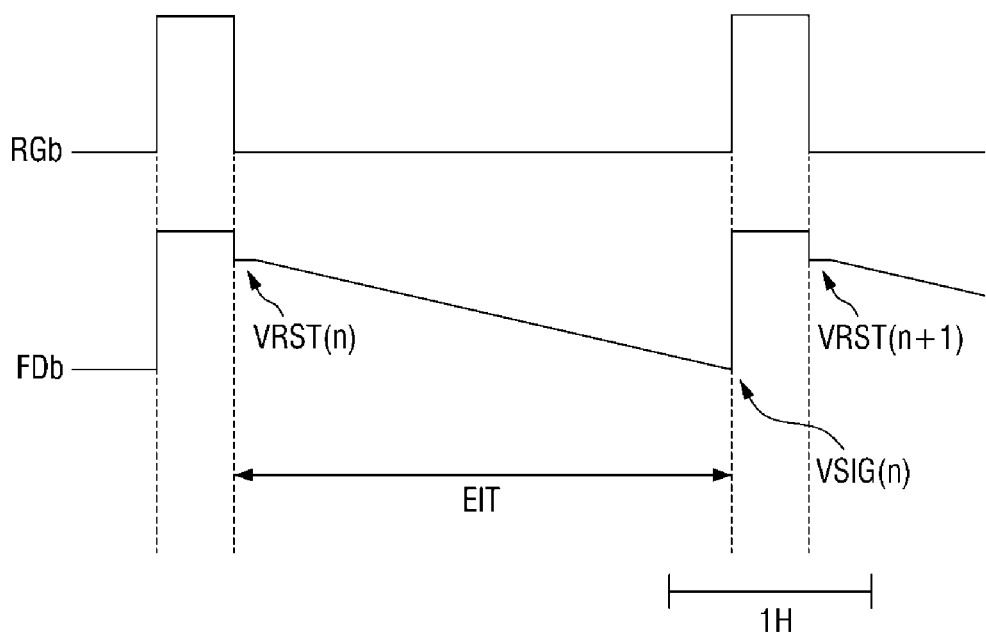

FIG. 13 is a timing chart illustrating the operation of the circuit of FIG. 12.

Referring to FIGS. 12 and 13, in the circuit of FIG. 12, since the pixel signal VOb to be output from the unit pixel PXb during one sensing period 1H includes a nth sensing voltage VSIG(n) and a $n+1^{st}$ reset voltage VRST(n+1), unlike the example embodiment described above with reference to FIG. 5, accurate correlated double sampling is difficult. That is, in the case of the example embodiment described above with reference to FIG. 5, correlated double sampling with higher reliability is possible as compared with the circuit of FIG. 12.

Figure 14:
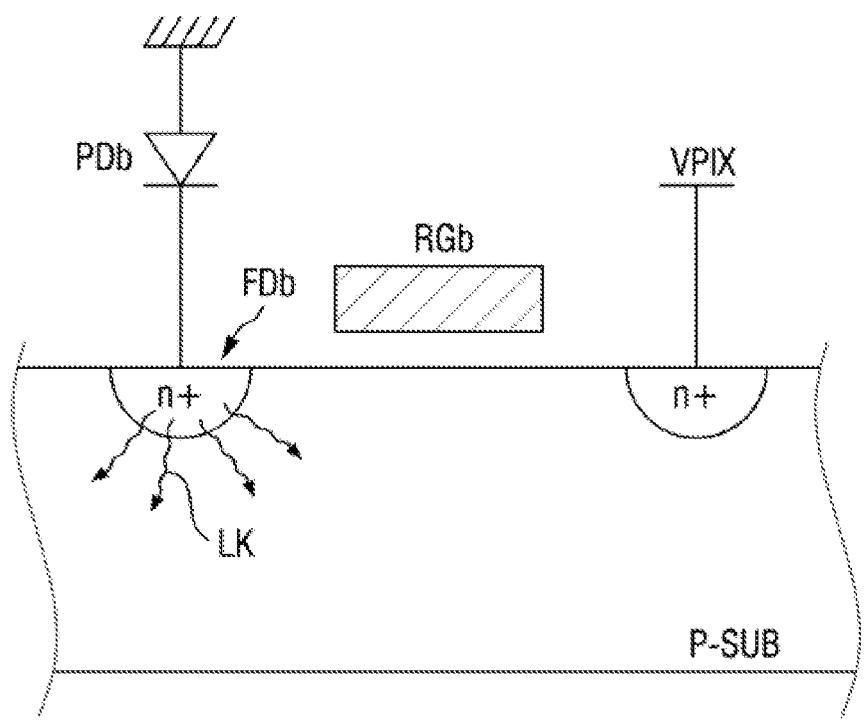

Furthermore, in the case of the circuit of FIG. 12, during the effective accumulation time EIT for accumulating the charge generated in the photoelectric element PDb, as illustrated in FIG. 14, a leakage LK of the charge occurs from the floating diffusion FDb to a P type substrate P-SUB, and thus, the dark level characteristics of the image sensing device 999 may deteriorate.

Figure 15:
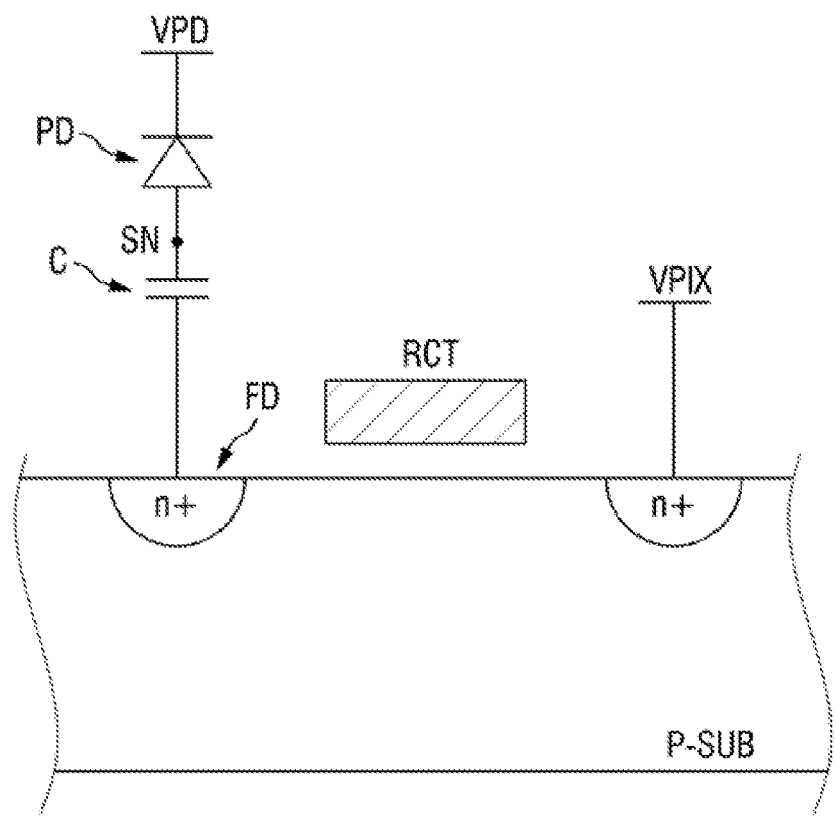

On the other hand, in the case of the example embodiment described above with reference to FIG. 5, as illustrated in FIG. 15, during the effective accumulation time EIT for accumulating charge generated in the photoelectric element PD, since the charge is stored in the storage node SN separated by the floating diffusion FD and the capacitor C, no leakage of charge occurs from the floating diffusion FD to the P type substrate P-SUB. Therefore, the dark level characteristic of the image sensing device 100 is improved, and the quality of the sensing image may be improved.

Hereinafter, an image sensing device according to example embodiments will be described with reference to FIGS. 16 and 17. Hereinafter, repeated description of the above-described embodiment will be omitted, and differences will be mainly described.

Figure 16:
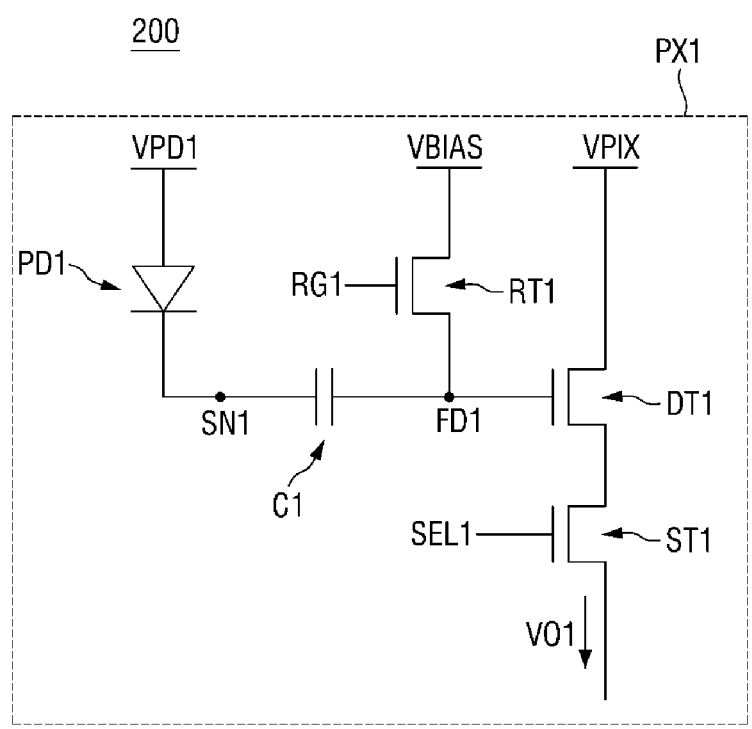
FIG. 16 is a unit pixel circuit diagram of the image sensing device according to example embodiments.

FIG. 16 is a unit pixel circuit diagram of the image sensing device according to example embodiments.

Referring to FIG. 16, the pixel PX1 may include a photoelectric element PD1, a reset transistor RT1, a driving transistor DT1, a selection transistor ST1, and a capacitor C1.

A gate terminal of the driving transistor DT1 is connected to the floating diffusion FD1, and the charge generated by the photoelectric element PD1 may be transferred to the floating diffusion FD1 through the storage node SN1. The driving transistor DT1 may operate as a source follower buffer amplifier by the charge transferred to the floating diffusion FD1. That is, the driving transistor DT1 may amplify the charge generated by the photoelectric element PD1 and transferred to the floating diffusion FD1 using the pixel voltage VPIX, and may transfer the charge to the selection transistor ST1.

The selection transistor ST1 may be turned on by the selection signal SEL, and may perform switching and addressing operations. When the selection signal SEL1 is applied from the row driver, the pixel signal VO1 may be output to a column line connected to the selection transistor ST1.

The reset transistor RT1 may be turned on by the reset signal RG1. When the reset transistor RT1 is turned on by the reset signal RG1, the floating diffusion FD1 may be reset to the bias voltage VBIAS. In example embodiments, the bias voltage VBIAS may be smaller than the pixel voltage VPIX.

A storage reset signal VPD1 may be provided to an anode of the photoelectric element PD1, and a cathode of the photoelectric element PD1 may be connected to the storage node SN1.

The capacitor C1 may be disposed between the storage node SN1 and the floating diffusion FD1.

Figure 17:
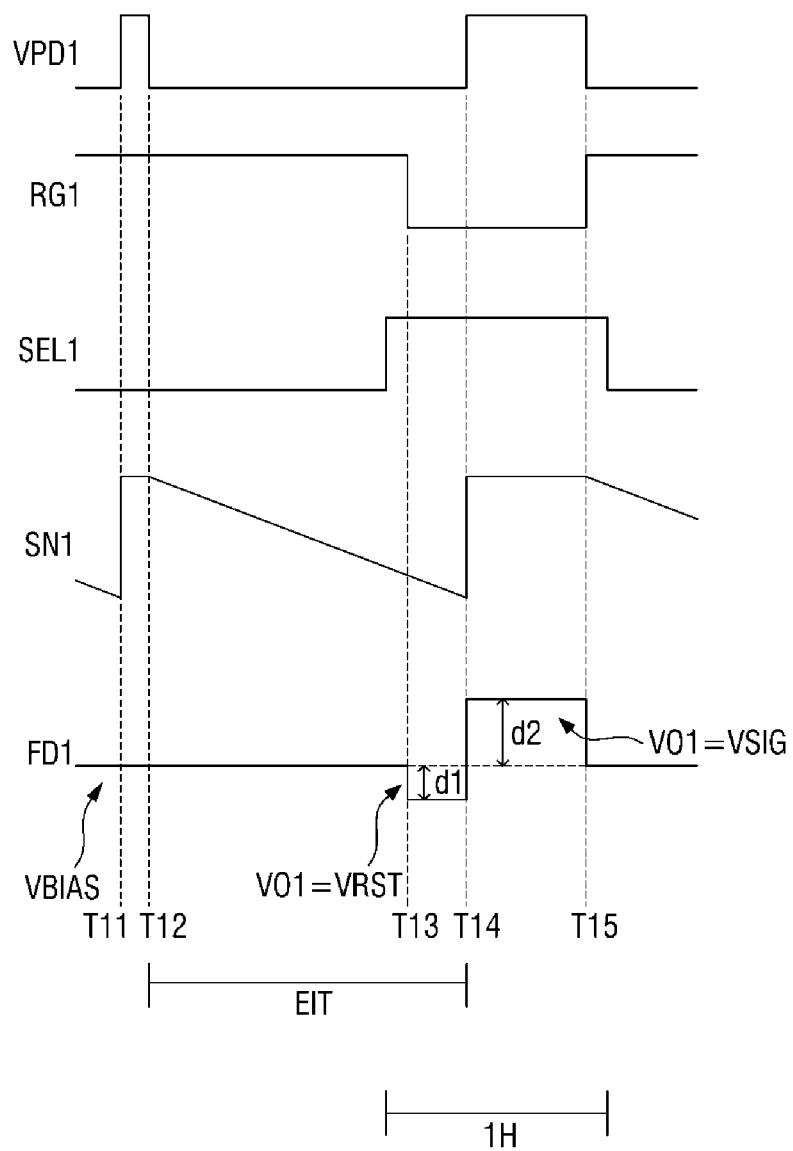
FIG. 17 is a timing chart illustrating the operation of the circuit of FIG. 16.

FIG. 17 is a timing chart illustrating the operation of the circuit of FIG. 16.

Referring to FIGS. 16 and 17, at the first time point T11, the storage reset signal VPD1 transits from the L level to the H level. That is, the storage reset signal VPD1 is enabled. As a result, the storage node SN1 may be filled with the charge. That is, the storage node SN1 may be reset.

The reset signal RG1 may maintain the H level as it is. That is, the reset signal RG1 may maintain the enable state. As the reset signal RG1 maintains the H level, the reset transistor RT1 (FIG. 16) maintains the turn-on state, and the bias voltage VBIAS may be provided to the floating diffusion FD1 accordingly. Therefore, the floating diffusion FD1 maintains the state that is reset to the bias voltage VBIAS.

The selection signal SEL1 may maintain the L level. That is, the selection signal SEL1 may maintain the disabled state. Therefore, the selection transistor ST1 (FIG. 16) maintains the turn-off state. As a result, the pixel signal VO1 (FIG. 16) is not output to the outside.

Next, at the second time point T12, the storage reset signal VPD1 transits from the H level to the L level. That is, the storage reset signal VPD1 is disabled. As a result, the charge level is reduced by the photoelectric element PD1 in the storage node SN1.

Although the floating diffusion FD1 is provided with the bias voltage VBIAS, since the floating diffusion FD1 and the storage node SN1 are separated by the capacitor C1, only the charge level of the storage node SN1 is reduced by the photoelectric element PD.

Thereafter, in a state in which the storage reset signal VPD1 maintains the L level at the third time point T13, the reset signal RG1 transits from the H level to the L level. That is, in a state in which the storage reset signal VPD1 is disabled, the reset signal RG1 is disabled.

As the reset signal RG1 is disabled, the reset transistor RT1 (FIG. 16) is turned off, and the floating diffusion FD1 floats. However, the charge level of the floating diffusion FD1 decreases by the first level d1 due to element characteristics.

In advance to the third time point T13, the selection signal SEL1 may already have changed from the L level to the H level. That is, the selection signal SEL1 is in the enabled state prior to the third time point T13. As a result, the driving transistor DT1 outputs the charge level of the floating diffusion FD1 to the outside as the pixel signal VO1, using the pixel voltage VPIX. At this time, since the charge level of the floating diffusion FD1 is a level decreased by the first level d1 from the bias voltage VBIAS, the pixel signal VO1 that is output from the pixel PX1 may be a reset voltage VRST decreased by the first level d1 from the reference voltage.

Thereafter, at the fourth time point T14, the storage reset signal VPD1 transits to the H level. That is, the storage reset signal VPD1 is enabled.

As the storage reset signal VPD1 is enabled, the storage node SN1 is reset, and the charge level of the floating diffusion FD1 decreases by the charge accumulated in the storage node SN1 by the capacitor C1. That is, the charge level of the floating diffusion FD1 increases by the second level d2 in comparison with the bias voltage VBIAS due to the influence of the storage node SN1.

As the selection signal SEL1 remains enabled at the fourth time point T14, the driving transistor DT1 outputs the charge level of the floating diffusion FD1 as the pixel signal VO1 to the outside, using the pixel voltage VPIX1. At this time, since the charge level of the floating diffusion FD1 is a level that increases by the second level d2 from the bias voltage VBIAS, the pixel signal VO1 that is output from the pixel PX1 may be a signal voltage VSIG that increases by the second level d2 from the reference voltage.

Thereafter, at a fifth time point T15, the storage reset signal VPD1 transits to the L level, and the reset signal RG1 transits to the H level. That is, the storage reset signal VPD1 is disabled and the reset signal RG1 is enabled. Thereafter, by repeating the operations described above, the unit pixel PX1 may generate and output the pixel signal VO1 on the basis of the information sensed by the photoelectric element PD1.

Hereinafter, since the process of generating a digital image signal based on the generated pixel signal VO1 has been described above, repeated description will not be provided.

Hereinafter, the operation in which the pixel signal VO1 that is output from the pixel PX1 is compared with the ramp signal will be described with reference to FIG. 18.

Figure 18:
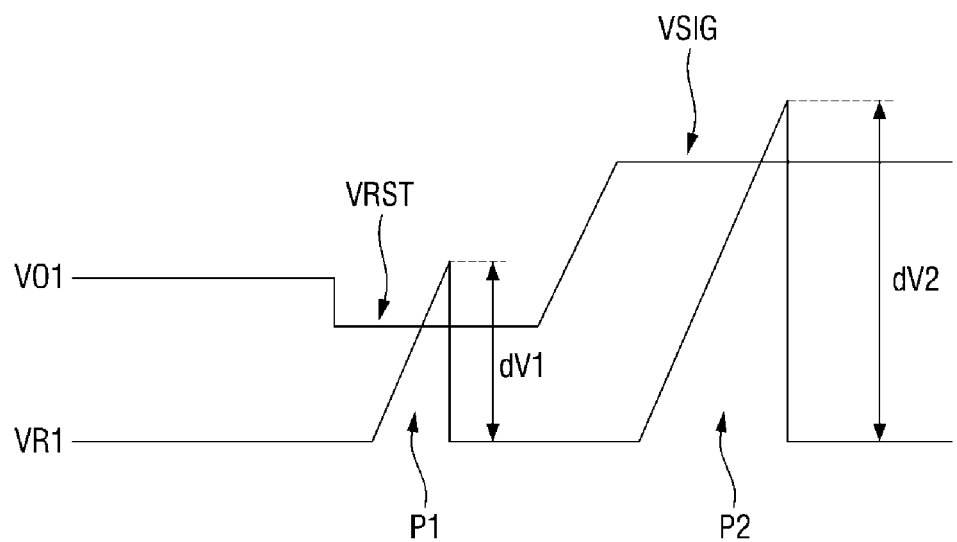
FIG. 18 is a diagram illustrating an operation in which a pixel signal output from the circuit of FIG. 16 is compared with a ramp signal.

FIG. 18 is a diagram illustrating an operation in which the pixel signal that is output from the circuit of FIG. 16 is compared with the ramp signal.

Referring to FIG. 18, a ramp signal VR1 according to the example embodiment may include a first pulse P1 having a magnitude increased by a first level dV1 from the reference voltage, and a second pulse P2 applied after the first pulse P1 and having a magnitude increased by a second level dV2 from the reference voltage.

Figure 19:
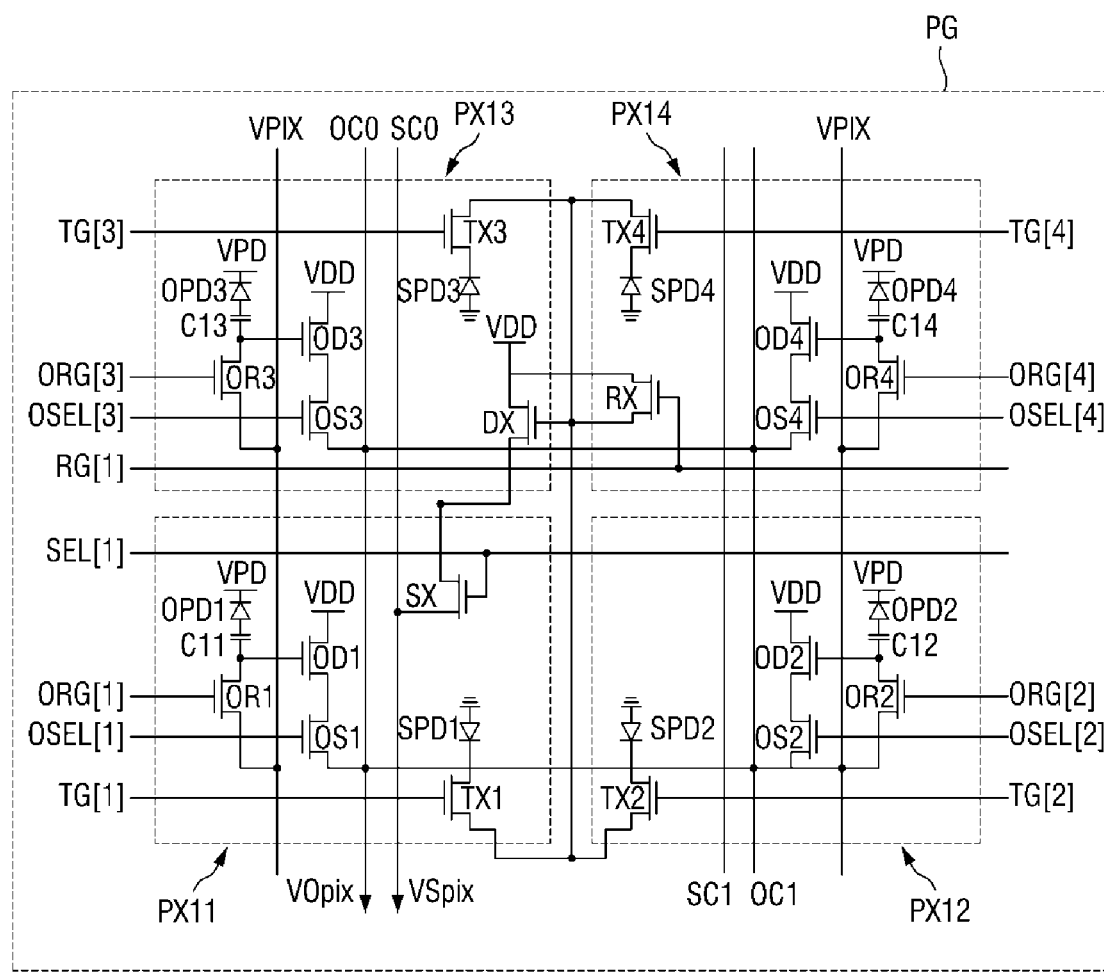
FIG. 19 is a circuit diagram of a pixel array of the image sensing device according to example embodiments.

In example embodiments, as illustrated in FIG. 18, the magnitude of the second pulse P2 may be greater than the magnitude of the first pulse P1. The comparator compares the ramp signal VR1 with the pixel signal VO1, and outputs the comparison result thereof to the counter as a comparison signal. The counter may count the comparison signal to convert the pixel signal VO1 into a digital signal. Since the description thereof has been given earlier, repeated description will not be provided. FIG. 19 is a circuit diagram of a pixel array of an image sensing device according to example embodiments.

Referring to FIG. 19, the image sensing device 300 may include a plurality of pixel groups PG.

The pixels PX11 to PX14 adjacent to one another may provide a pixel group PG, and the pixel group PG may include, for example, four pixels PX11 to PX14 arranged in a 2×2 matrix form. Each of the four pixels PX11 to PX14 included in the pixel group PG may include a first circuit and a second circuit.

Each of the first circuits included in the pixel group PG may be, for example, connected to the first photoelectric elements OPD1 to OPD4 including organic photodiodes to generate a first pixel signal VOpix. A storage reset signal VPD may be provided at one ends of the first photoelectric elements OPD1 to OPD4.

Each of the second circuits included in the pixel group PG may be connected, for example, to the second photoelectric elements SPD1 to SPD4 including semiconductor photodiodes to generate a second pixel signal VSpix. Each of the first pixel signal VOpix and the second pixel signal VSpix may be output through a first column line OC0 and a second column line SC0, respectively.

The first circuit included in each of the pixels PX11 to PX14 may be implemented as a 3T circuit including three transistors.

For example, the first circuit included in the first pixel PX1 may include a reset transistor OR1, a driving transistor OD1, a selection transistor OS1, and a capacitor C11. Each of the reset transistor OR1 and the selection transistor OS1 may be controlled by a reset signal ORG[1] and a selection signal OSEL[1] that are input by the row driver.

In each sensing period, the row driver may turn on only one of the four selection transistors OS1 to OS4 included in the first circuits of one pixel group PG. Therefore, a plurality of first circuits included in the pixel group PG may share one first column line OC0.

Each of the second circuits may be implemented as a 4T circuit including four transistors.

For example, the second circuit of the first pixel PX11 may include a transmission transistor TX1, a reset transistor RX, a selection transistor SX, and a driving transistor DX. The reset transistor RX, the selection transistor SX, and the driving transistor DX may also be connected to transmission transistors TX2 to TX4 included in other pixels. That is, the second circuits included in one pixel group PG may share the reset transistor RX, the selection transistor SX, and the driving transistor DX.

The transmission transistors TX1 to TX4 included in one pixel group PG may be controlled by transmission signals TG[1] to TG[4] different from one another.

In each sensing period, the row driver may input the transmission signals TG[1] to TG[4] to turn on only one of the transmission transistors TX1 to TX4. Accordingly, the plurality of second pixel circuits included in the pixel group PG may share the reset transistor RX, the selection transistor SX, the driving transistor DX, and the second column line SC0.

In example embodiments, the output orders of the first pixel signal VOpix and the second pixel signal VSpix through the first column line OC0 and the second column line SC0 may be the same as each other.

For example, the selection transistor OS1 of the first pixel PX11 may be turned on at the first sensing period, while all of the other selection transistors OS2 to OS4 included in other pixels PX12 to PX14 may be turned off. Therefore, the first pixel signal VOpix generated by the first circuit of the first pixel PX11 using the charge of the first photoelectric element OPD1 may be output through the first column line OC0 during the first sensing period.

At the same time, at the first sensing period, the transmission transistor TX1 of the first pixel PX11 may be turned on, while all of the other transmission transistors TX2 to X4 included in other pixels PX12 to PX14 may be turned off. Accordingly, the second pixel signal VSpix generated by the second circuit of the first pixel PX11 may be output through the second column line SC0 during the first sensing period.

In this way, by turning on only one of the selection transistors OS1 to OS4 at each sensing period, and by turning only one of the transmission transistors TX1 to TX4, each of the first and second circuits included in one pixel group PG may share the first column line OC0 and the second column line SC0.

Figure 20:
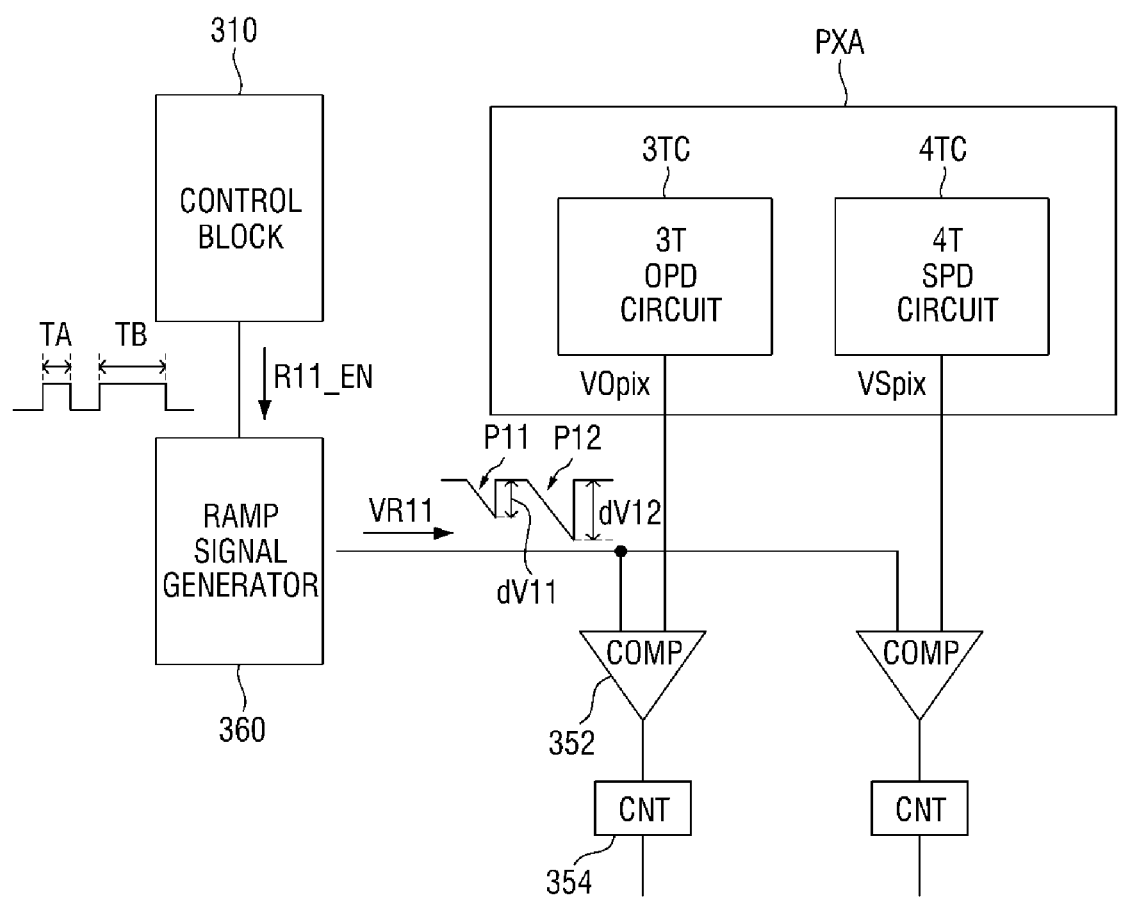
FIG. 20 is a diagram illustrating the operation of the image sensing device according to example embodiments.

FIG. 20 is a diagram illustrating the operation of the image sensing device according to example embodiments.

Referring to FIG. 20, the first pixel signal VOpix is provided to the comparator 352 from the 3T circuit 3TC included in the pixel array PXA, and the second pixel signal VSpix may be provided to the comparator 352 from the 4T circuit 4TC.

The control register block 310 generates a ramp enable signal R11_EN which is enabled during the first time TA and then enabled for a second time TB longer than the first time TA at one sensing period, and may provide the ramp enable signal R11_EN to the ramp signal generator 360.

The ramp signal generator 360 may provide the comparator 352 with a ramp signal VR11 to which a first pulse P11 having a magnitude decreased by a first level dV11 from the reference voltage, and a second pulse P12 having a magnitude decreased by a second level dV12 from the reference voltage are sequentially applied, in response to the ramp enable signal R11_EN.

Specifically, the ramp signal generator 360 sequentially generates the first pulse P11 having the first magnitude and the second pulse P12 having the second magnitude greater than the first magnitude as the ramp signal VR11 in response to the ramp enable signal R11_EN during one sensing period, and may provide the ramp signal VR11 to the comparator 352.

The comparator 352 compares the ramp signal VR11 with the pixel signals VOpix and VSpix from a specific time point, for example, a time point at which the comparator 352 is enabled, and may output the comparison result thereof as a comparison signal to the counter 354. The counter 354 may count the comparison signal and convert the pixel signals VOpix and VSpix into a digital signal.

The image sensing device 300 according to the example embodiment may compare all of the first pixel signal VOpix output from the 3T circuit 3TC and the second pixel signal VSpix output from the 4T circuit 4TC with the ramp signal VR11 to which the first pulse P11 having the first magnitude and the second pulse P12 having the second magnitude greater than the first magnitude are sequentially applied, thereby outputting the digital image data.

While example embodiments have been described with reference to the figures, it will be understood by those of ordinary skill in the art that various changes in form and details may be made therein without departing from the spirit and scope as defined by the following claims.

What is claimed is:

1. An image sensing device comprising:
   a photoelectric element configured to receive a reset signal at a first end and connected to a sensing node at a second end;
   a reset transistor configured to reset a floating diffusion at a first voltage;
   a capacitor disposed between the floating diffusion and the sensing node;
   a driving transistor configured to generate a pixel signal from a charge generated by the photoelectric element based on a second voltage;
   a selection transistor configured to provide the pixel signal to an external device; and
   a timing generator configured to turn off the reset transistor while the selection transistor is turned on at a first time point, and while the selection transistor is turned on, reset the sensing node by the reset signal at a second time point that is later than the first time point.

2. The image sensing device of claim 1, wherein the reset signal is received by a cathode of the photoelectric element, and the sensing node is connected to an anode of the photoelectric element.

3. The image sensing device of claim 2, wherein the first voltage and the second voltage are the same.

4. The image sensing device of claim 1, wherein the reset signal is received by an anode of the photoelectric element, and the sensing node is connected to a cathode of the photoelectric element.

5. The image sensing device of claim 4, wherein the first voltage is smaller than the second voltage.

6. The image sensing device of claim 1, wherein while the selection transistor is turned on, the pixel signal comprises a reset voltage changed from the first voltage by a first amount, and a signal voltage changed from the first voltage by a second amount that is greater than the first amount.

7. The image sensing device of claim 6, wherein a voltage of the pixel signal is the reset voltage at the first time point, and the voltage of the pixel signal is the signal voltage at the second time point.

8. The image sensing device of claim 1, wherein the capacitor comprises:
   a top electrode and a bottom electrode, each of which is formed in a hollow cylindrical shape; and
   a dielectric film disposed conformally between the top electrode and the bottom electrode along a surface of the bottom electrode.

9. The image sensing device of claim 1, wherein the photoelectric element comprises an organic photo diode.

10. An image sensing device comprising:
    a pixel array comprising at least one pixel; and
    a timing generator configured to provide a first reset signal, a second reset signal, and a selection signal to the pixel array,
    wherein each of the at least one pixel comprises:
      a photoelectric element configured to reset a storage node connected to a first end based on the first reset signal received at a second end,
      a reset transistor gated to the second reset signal and configured to reset a floating diffusion,
      a capacitor disposed between the storage node and the floating diffusion,
      a driving transistor configured to generate a pixel signal based on a charge generated by the photoelectric element, and a selection transistor which is gated to a selection signal and configured to output the pixel signal to an external device, and the timing generator configured to first disable the second reset signal while enabling the selection signal, and then enable the first reset signal while the selection signal is enabled.

11. The image sensing device of claim 10, wherein disabling of the second reset signal by the timing generator comprises transitioning the second reset signal of a logical high level to a logical low level, and enabling of the first reset signal by the timing generator comprises transitioning the first reset signal of the logical high level to the logical low level.

12. The image sensing device of claim 10, wherein disabling of the second reset signal by the timing generator comprises transitioning the second reset signal of a logical high level to a logical low level, and enabling of the first reset signal by the timing generator comprises transitioning the first reset signal of the logical low level to the logical high level.

13. The image sensing device of claim 10, wherein while the second reset signal is disabled and the floating diffusion is in a floating state, the storage node accumulates the charges generated by the photoelectric element.

14. The image sensing device of claim 10, further comprising:

a logic circuit region; and a pixel array region disposed on the logic circuit region, wherein the timing generator is disposed in the logic circuit region, and wherein the capacitor and the photoelectric element are disposed in the pixel array region.

15. The image sensing device of claim 14, wherein the capacitor comprises:

a top electrode and a bottom electrode formed in a cylindrical shape, and a dielectric film disposed conformally between the top electrode and the bottom electrode along a surface of the bottom electrode.

16. An image sensing device comprising:

a first circuit configured to generate a first pixel signal based on a charge generated by a first photoelectric element using three transistors and configured to output the first pixel signal to a first comparator;

a second circuit configured to generate a second pixel signal based on a charge generated by a second photoelectric element using four transistors and configured to output the second pixel signal to a second comparator;

a ramp signal generator configured to provide a first ramp signal to the first comparator and configured to provide a second ramp signal to the second comparator; and a timing generator configured to provide a first reset signal, a second reset signal, and a selection signal to the first circuit, wherein the ramp signal generator is configured to provide the first comparator with a first ramp signal to which a first pulse of a first magnitude and a second pulse of a second magnitude that is greater than the first magnitude are sequentially applied, and configured to provide the second comparator with a second ramp signal to which a third pulse of a third magnitude and a fourth pulse of a fourth magnitude that is greater than the third magnitude are sequentially applied, during a sensing period of the first pixel signal and the second pixel signal, wherein the first circuit comprises:

a first reset transistor configured to reset a first floating node based on the second reset signal, a first driving transistor configured to generate the first pixel signal based on the charge generated by the first photoelectric element, a first selection transistor configured to transfer the first pixel signal to the first comparator based on the selection signal, and a capacitor disposed between the first floating node and a sensing node connected to the first photoelectric element, wherein the first reset transistor is configured to turn off by the second reset signal while the first selection transistor is turned on, and wherein the first photoelectric element is configured to reset the sensing node by the first reset signal while the selection transistor is turned on.

17. The image sensing device of claim 16, wherein the second circuit comprises:

a second reset transistor configured to reset a second floating node, a second driving transistor configured to generate the second pixel signal based on the charge generated by the second photoelectric element, a transmission transistor configured to receive a transmission signal and transfer the charge generated by the second photoelectric element to the second driving transistor, and a second selection transistor configured to transmit the second pixel signal to the second comparator.

18. The image sensing device of claim 16, wherein the ramp signal generator is configured to receive a ramp enable signal to generate the first ramp signal and the second ramp signal, and the ramp enable signal is enabled for a first period and then enabled for a second period that is longer than the first period.

19. The image sensing device of claim 16, wherein the first photoelectric element comprises an organic photo diode, and the second photoelectric element comprises a semiconductor photo diode.

* * * * *